United States Patent [19]

Platzoeder et al.

[11] 3,774,085

[45] Nov. 20, 1973

[54] THYRISTOR WITH MEANS FOR INTERNAL BREAKTHROUGH

[76] Inventors: Karl Platzoeder; Peter Voss, both of Muenchen, Germany

[22] Filed: Aug. 17, 1972

[21] Appl. No.: 281,469

[30] Foreign Application Priority Data

Aug. 23, 1971 Germany .................. P 21 42 204.8

[52] U.S. Cl. 317/235 R, 317/235 AB, 317/235 AM, 317/235 AN

[51] Int. Cl. ......................... H01l 11/00, H01l 15/00

[58] Field of Search ................. 317/235, 41.1, 48.1, 317/48.2

[56] References Cited

UNITED STATES PATENTS

| | | | |
|---|---|---|---|
| 3,331,000 | 7/1967 | Moyson et al. | 317/235 AB |
| 3,487,276 | 12/1969 | Wollex | 317/235 AB |
| 3,662,233 | 5/1972 | Clerc et al. | 317/235 AB |

*Primary Examiner*—John W. Huckert
*Assistant Examiner*—Andrew J. James
*Attorney*—Benjamin H. Sherman et al.

[57] ABSTRACT

A thyristor including an emitter, a *p*-base and an *n*-base wherein a gate electrode is positioned on a free surface of the *p*-base and an emitter electrode is positioned on the emitter, with the area dimension encompassed by the electrodes being smaller than that of the thyristor. The *n*-base is provided with an area below the gate electrode and within the area encompassed by the electrodes that is characterized by a resistivity about 10 to 40 percent lower than the resistivity of areas outside the electrode encompassed area. By having the area of the *n*-base below the electrodes of lower resistivity, the breakover voltage of this area is reached prior to that of the outer or border areas of the thyristor. When a voltage exceeding the breakover voltage is applied to the thyristor, the *n*-base area below the electrodes triggers first and border breakthrough of high current loads is avoided. In embodiments wherein short-circuit rings are utilized, expansion of the triggering process is not prevented. High di/dt values are possible during a breakover triggering process.

7 Claims, 3 Drawing Figures

THYRISTOR WITH MEANS FOR INTERNAL BREAKTHROUGH

BACKGROUND OF THE INVENTION

1. Field of the Invention

The invention relates to multilayer semiconductor devices and more particularly to thyristors that gate without destructive breakover triggering.

2. Prior Art

A thyristor is generally a four-layer semiconductor device in which alternate layers are of opposite conductivity types. The layer of *n*-type conductivity at one end of a thyristor is usually referred to as the emitter or cathode. The *p*-type adjacent layer is usually referred to as a base, a first base, or a *p*-base. The next adjacent layer is sometimes referred to as a second base or an *n*-base. The layer furthest from the emitter is usually referred to as a second emitter or as an anode. A source of potential is connected across the device to bias the anode positive relative to the emitter. A trigger or gate electrode is connected to the first base, which when energized with a suitable positive signal with respect to the emitter, turns the device on. Although undesirable, the device may also be turned on when a voltage exceeding the forward breakover voltage is supplied between the anode and emitter.

A common thyristor type is a four-layer block or chip of semiconductor material with the emitter diffused into the upper surface of the first base as a ring-shaped area. This leaves the central portion of the thyristor for emplacement of a gate electrode thereon. An emitter electrode is placed in contact with the emitter and the anode is provided with a conductive film so as to form an anode electrode.

When a forward polarity voltage exceeding the gating or breakover voltage of a thyristor is applied to such a thyristor, the thyristor is triggered or gated without receiving a control voltage via the gate electrode. This type of gating is referred to as "breakover triggering."

Generally, it is known that breakover triggering may destroy conventional thyristors even at weak current loads. Such destruction is thought to be caused by two factors. First, when a voltage exceeding the gating voltage (breakover voltage) is applied in the forward blocking direction, an avalanche breakdown occurs at an edge of the thyristor. The current flowing in the border area during the avalanche breakdown is concentrated on a very small area. This small area is thus subjected to a high specific stress and may be overheated so as to destroy the thyristor. The second destructive factor in breakover triggering is that border areas of thyristors are frequently provided with a short-circuit ring to improve the transient characteristics thereof. In such thyristors, part of the avalanche current flows directly from the base (*p*-base) into the short-circuit ring and a smaller part of the avalanche current flows to the emitter. Accordingly, expansion of the triggering or gating process is obstructed in such a manner that breakover triggering takes place at very low di/dt values. When such values are exceeded, destructively high specific stresses occur, tending to destroy the thyristor.

SUMMARY OF THE INVENTION

The present invention provides a novel arrangement of a thyristor so that it is gated or triggered within an area encompassed by the electrodes thereof when a voltage exceeding the gating voltage is applied.

It is a novel feature of the invention to have a select area of a second base of a thyristor located below the periphery of at least the gate electrode thereof which is formed with a higher impurity concentration than that situated outwardly of the selected area.

It is a further feature of the invention to have a predetermined relative relationship between the resistivity of the select area (of the second base) lying within the periphery of the electrodes and the resistivity of areas situated outwardly of such select area. In preferred embodiments, the resistivity of the select area is about 10 to 40 percent lower than the lowest resistivity of the outward areas.

DETAILED DESCRIPTION OF THE PREFERRED EMBODIMENTS

Figure 1:
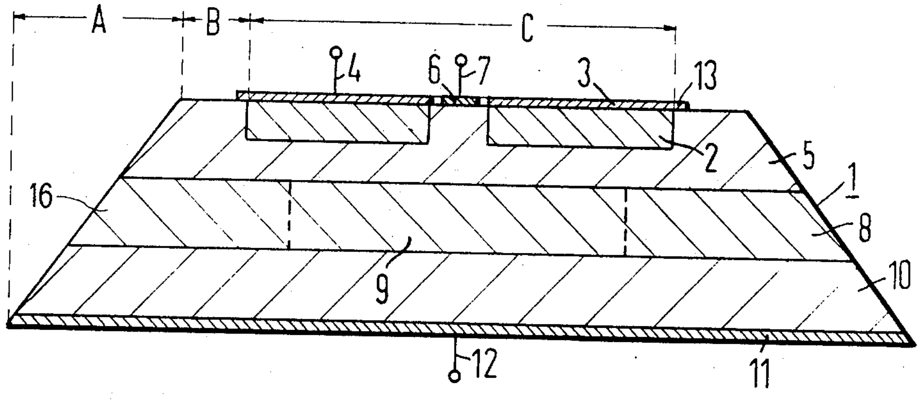
FIG. 1 is an elevated sectional view of a thyristor embodying the principles of the invention.

FIG. 1 is a sectional view and illustrates a thyristor 1 of the invention of generally truncated conical shape comprising an input lead 12 which is connected to a conducting layer 11, as of molybdenum or other suitable conducting material which is attached to one side of, for example, a *p*-type semiconductor layer 10. An *n*-type semiconductor second base layer 8 is attached to the second side of layer 10 and includes a central portion 9 (shown separated by dotted lines) which has a lower resistivity than its other portions 16. A *p*-type semiconductor type layer 5 is attached to the layer 8 on the side away from layer 10. An annular emitter region 2 of *n*-type semiconductor material is formed in layer 5 in the side away from layer 8 and a conductive electrode 3 is attached to the emitter 2. A lead 4 is attached to electrode 3.

A gate or trigger electrode 6 is attached to the surface of layer 5 on the side away from layer 8 and a gate lead 7 is attached to electrode 6.

The portion 9 of layer 8 of lower resistivity is generally located below the gate electrode 6 as shown, however, it may in certain embodiments, be located or extend beneath the emitter electrode 3. The portion 9, however, does not extend beyond the area of the electrodes 3 and 6.

The resistivity of portion or area 9 is preferably about 10 to 40 percent lower than that of the remaining portions 16 of layer 8. In embodiments wherein the semiconductor material of the thyristor is non-homogeneous, the select area 9 of the second base (lying beneath the electrodes) is provided with a resistivity lower than the lowest resistivity of the areas 16. In such embodiments, it is preferred that the resistivity of the select area 9 of the second base be about 10 to 40 percent lower than the lowest resistivity of areas 16.

The publication "Solid State Electronics," Vol. 1, pages 202–210 (1960) suggests that, for example, crucible-drawn rods of a semiconductor material have fluctuations in resistivity across cross-sections thereof. However, this publication makes no suggestions of any applicability of this fact to a thyristor.

In the embodiment shown, emitter electrode 3 has a portion which extends over the surface of layer 5 and forms a short-circuit ring 13. The principles of the invention are applicable to thyristors without short-circuit rings, and such embodiments are accordingly within the scope of the invention.

Figure 2:
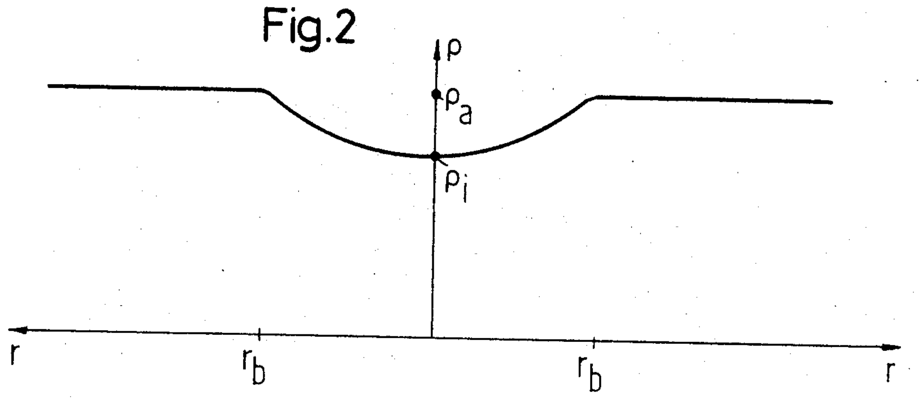
FIG. 2 is a graph showing the resistivity of the second base of the structure of FIG. 1 as a function of the radius thereof.

FIG. 2 illustrates that the specific resistivity of a semiconductor member is dependent upon the radius thereof. As shown, the semiconductor member 1 has a radius "$r$" and the portion 9 of second base 8 has a radius "$r_b$." The resistivity of portion 16 of the second base 8 is designated $\rho_a$ and the lowest resistivity in portion 9 is designated $\rho_i$. In the exemplary embodiment illustrated in the graph, the resistivity $\rho_i$ is, for example, 25 percent below the resistivity $\rho_a$. Thus, in the center of area 9, a gating voltage is created that is about 10 percent below the gating voltage in portions 16 of the semi-conductor member. When the voltage is applied between leads 7 and 12, a breakthrough will occur in portion 9 before a breakthrough takes place at the edges of semiconductor member 1. The triggering or gating process is initiated by a charge-carrier multiplication at the blocking pn junction between bases 8 and 5. When this occurs, the voltage between leads 7 and 12 collapses.

The differential in resistivity in regions 9 and 16 of second base 8 causes the thyristor to trigger within a desired area, designated C in FIG. 1. Within such selected area C, breakover triggering is possible with high di/dt values. However, should the breakdown be initated in an area such as B in FIG. 1, the avalanche current would divide. Part of the avalanche current would bypass emitter 2 and flow via short-circuit rings 13 to the emitter electrode 3 and a smaller part of such current would flow into emitter 2 and initiate a triggering process at the outer edges. In such a situation, the triggering process expands slowly, so that the semiconductor member is destroyed when high di/dt values are present. Further, the resistivity differential provided by regions 9 and 16 within second base 8 prevents surface breakthrough in the area designated A in FIG. 1.

Figure 3:
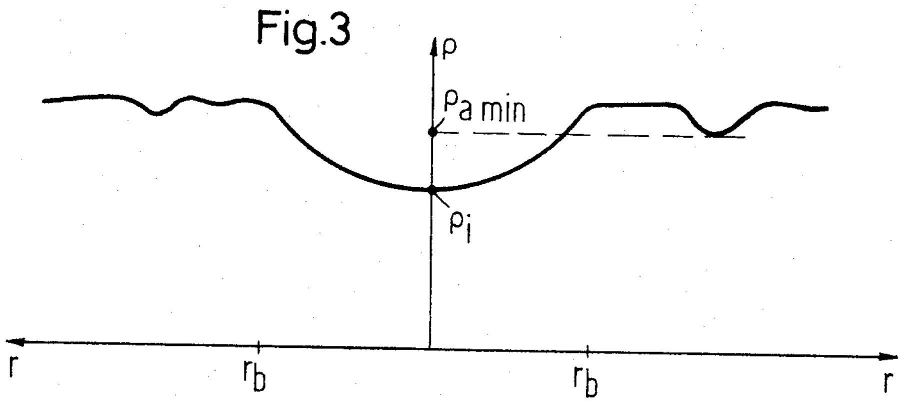
FIG. 3 is a graph showing the resistivity of a second base in a modified thyristor embodying the principles of the invention.

In the foregoing discussion, it was assumed that the impurity concentration, and thus the resistivity in area 16 is substantially homogeneous. Dopant, or impurity concentration, in, for example, base 8, is regulated by various techniques, such as outdiffusion or masking. The impurity concentration within area 9 is selectively higher than the impurity concentration, whether homogeneous or otherwise, in areas 16. In embodiments wherein a non-homogeneous impurity concentration or resistivity is present in areas 16, the resistivity characteristics of such a thyristor are similar to that illustrated in FIG. 3. In FIG. 3, the lowest resistivity of areas 16 outward of area 9 in a second base of a thyristor having non-homogeneous impurities at such outward areas, is designated $\rho_{a\ min}$. The resistivity $\rho_i$ in area 9 is adjusted, as by controlling the impurity concentration therein, so as to be 10 to 40 percent below the lowest resistivity $\rho_{a\ min}$ outside area 9.

In the two exemplary embodiments of the invention discussed hereinabove, the select area 9 is relatively large. However, in other embodiments, a select area of the second base, such as 9, may be of substantially smaller dimension, for example, so as to occupy an area only below the gate electrode 6. In such embodiments, when a breakdown occurs in this small resistivity area, the current carriers flow through the first base toward the gate electrode and from there to the emitter where the triggering process is initiated.

As is apparent from the foregoing specification, the present invention is susceptible of being embodied with various alterations and modifications which may differ from those that have been described in the preceding specification and description. For this reason, it is to be fully understood that all of the foregoing is intended to be merely illustrative and is not to be construed or interpreted as being restrictive or otherwise limiting of the present invention, excepting as is set forth and defined in the hereto-appended claims.

We claim:

1. A thyristor comprising a semiconductor member having at least four zones with adjacent zones being of opposite conductivity types, a first zone being an emitter, a second zone being a first base and a third zone being a second base, and including a gate electrode in contact with said first base and an emitter electrode in contact with said emitter, said second base having a first portion located beneath said electrodes, said first portion of said second base having a resistivity 10 to 40 percent below the resistivity of the remaining portion of said second base.

2. A thyristor as defined in claim 1 wherein said first portion of the second base has a resistivity less than the resistivity of any region of said remaining portion.

3. A thyristor as defined in claim 2 wherein the resistivity of said first portion is 10 to 40 percent lower than the resistivity of any region of said remaining portion.

4. A thyristor as defined in claim 1 wherein said first portion of the second base is located beneath the gate electrode and beneath a part of the emitter electrode adjacent said gate electrode.

5. A thyristor comprising a monolithic semiconductor device with a plurality of zones of alternate conductivity types, a first zone being an emitter, a second zone being a first base, and a third zone being a second base, said emitter being positioned on select areas of said first base leaving other areas thereof free, a gate electrode of a dimension smaller than said semiconductor device in contact with a free area of said first base and an emitter electrode spaced from said gate electrode and in contact with said emitter, said second base having a first portion beneath at least said gate electrode with a resistivity 10 to 40 percent below the resistivity of remaining portion of said second base.

6. A thyristor as defined in claim 5 wherein the resistivity of said first portion of the second base is below the lowest resistivity of said remaining portion.

7. A thyristor as defined in claim 5 wherein said first portion of the second base is located beneath the gate electrode and within the area encompassed by at least a porion of the emitter electrode.

* * * * *